(12) United States Patent
Kim

(10) Patent No.: US 9,117,545 B1
(45) Date of Patent: Aug. 25, 2015

(54) SENSE-AMPLIFIER DRIVING DEVICE AND SEMICONDUCTOR DEVICE INCLUDING THE SAME

(71) Applicant: SK HYNIX INC., Icheon (KR)

(72) Inventor: Jang Geun Kim, Seongnam-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/464,595

(22) Filed: Aug. 20, 2014

(30) Foreign Application Priority Data

Jun. 3, 2014 (KR) .................. 10-2014-0067702

(51) Int. Cl.
| | | |
|---|---|---|
| G11C 7/00 | (2006.01) | |
| G11C 11/406 | (2006.01) | |
| G11C 11/4091 | (2006.01) | |
| G11C 11/408 | (2006.01) | |
| H03F 3/16 | (2006.01) | |

(52) U.S. Cl.
CPC ...... *G11C 11/40615* (2013.01); *G11C 11/4085* (2013.01); *G11C 11/4091* (2013.01); *H03F 3/16* (2013.01); *H03F 2200/462* (2013.01)

(58) Field of Classification Search
CPC ........... G11C 11/2273; G11C 11/4074; G11C 11/4091; G11C 2207/065; G11C 7/06
USPC ................ 365/189.11, 189.09, 205
See application file for complete search history.

(56) References Cited

U.S. PATENT DOCUMENTS

| | | | | |
|---|---|---|---|---|
| 6,128,213 A | * | 10/2000 | Kang | ............................ 365/145 |
| 6,574,151 B2 | * | 6/2003 | Park | ......................... 365/189.11 |
| 8,432,762 B2 | | 4/2013 | Kim et al. | |
| 2015/0046723 A1 | * | 2/2015 | Park et al. | ................ 365/189.11 |

FOREIGN PATENT DOCUMENTS

| | | |
|---|---|---|
| KR | 10-2008-0001277 A | 1/2008 |
| KR | 10-2009-0047980 A | 5/2009 |
| KR | 10-1033466 B1 | 5/2011 |

* cited by examiner

*Primary Examiner* — Tuan T Nguyen

(57) ABSTRACT

A semiconductor device includes a sense-amplifier driving device. The sense-amplifier driving device includes a sense-amplifier driver configured to provide a first pull-up voltage and a first pull-down voltage to a pull-up power line and a pull-down power line, respectively, during a first over-driving time period, provide the second pull-up voltage and the first pull-down voltage to the pull-up power line and the pull-down power line, respectively, during an active time period, and provide a third pull-up voltage and a second pull-down voltage to the pull-up power line and the pull-down power line, respectively, during a second over-driving time period, and a drive-signal generator configured to generate a plurality of drive signals, which is selectively activated during the first over-driving time period, the active time period, and the second over-driving time period, to control an operation of the sense-amplifier driver.

20 Claims, 5 Drawing Sheets

SENSE-AMPLIFIER DRIVING DEVICE AND SEMICONDUCTOR DEVICE INCLUDING THE SAME

CROSS-REFERENCE TO RELATED APPLICATION

This application claims priority to Korean Patent Application No. 10-2014-0067702, filed on Jun. 3, 2014, the disclosure of which is hereby incorporated in its entirety by reference.

BACKGROUND

Embodiments of the present disclosure relate to a sense-amplifier driving device and a semiconductor device including the same.

With increases in the degree of integration of semiconductor memory devices, the operation speed of semiconductor memory devices has also been continuously improved. In order to increase the operation speed of a semiconductor memory device, a synchronous memory device operating in synchronization with an external clock has been proposed and developed.

A representative synchronous memory device is a single data rate (SDR) synchronous memory device, which is synchronized with a rising edge of an external clock such that one piece of data is input or output via one data pin during one cycle of the external clock.

However, the ability of an SDR synchronous memory device to satisfy the demands of a high-speed operation of a system is limited. In order to solve the problem of the SDR synchronous memory device, a double data rate (DDR) synchronous memory device capable of processing two pieces of data during one clock cycle has been proposed.

In a DDR synchronous memory device, two contiguous pieces of data are input or output via respective data input/output (I/O) pins, and the two contiguous pieces of data are synchronized with a rising edge and a falling edge of an external clock, respectively. Therefore, although the clock frequency of a DDR synchronous memory device does not increase, the DDR synchronous memory device has a bandwidth that is at least two times larger than that of a SDR synchronous memory device. As a result, a DDR synchronous memory device can operate at a higher speed than a SDR synchronous memory device.

A dynamic random access memory (DRAM) is a representative volatile memory. A memory cell of the DRAM includes one cell transistor and one cell capacitor. The cell transistor controls access to the cell capacitor, and the cell capacitor stores electric charges corresponding to data. Data stored in the cell capacitor is classified into high-level data and low-level data according to the amount of electric charges stored in the cell capacitor.

Since electric charges are applied to or leak out from the cell capacitor of the memory cell of the DRAM by a leakage component, the corresponding data should be periodically re-written into the cell capacitor. The periodic storing operation for maintaining desired data in the memory cell is referred to as a 'refresh' operation.

A memory cell of a DRAM is activated in an active mode. A bit-line sense-amplifier (sense-amp) circuit senses and amplifies data received from the activated memory cell, and re-transmits the amplified data to the memory cell. After that, the memory cell is deactivated in a precharge mode and maintains data stored therein. The refresh operation is performed by repeatedly performing active and precharge operations at intervals of a predetermined time.

However, as the voltage level of an external power-supply voltage VDD decreases, as indicated in the LPDDR4 specification of a DRAM, a core voltage Vcore having a lower voltage level than the power-supply voltage VDD is used as an internal voltage, resulting in reduction of the data retention time of a memory cell. Therefore, refresh characteristics of a DRAM are gradually deteriorated in proportion to the voltage level of the external power-supply voltage VDD when the DRAM operates at a high speed.

BRIEF SUMMARY

Various embodiments of the present disclosure are directed to a sense-amplifier driving device and a semiconductor device including the same, which substantially obviate one or more problems due to limitations and disadvantages of the related art.

Embodiments of the present disclosure relate to a technology for improving refresh characteristics of a semiconductor device so as to increase a data retention time.

In accordance with an embodiment of the present disclosure, a sense-amplifier driving device includes: a sense-amplifier driver configured to provide a first pull-up voltage and a first pull-down voltage to a pull-up power line and a pull-down power line, respectively, during a first over-driving time period, provide a second pull-up voltage and the first pull-down voltage to the pull-up power line and the pull-down power line, respectively, during an active time period, and provide a third pull-up voltage and a second pull-down voltage to the pull-up power line and the pull-down power line, respectively, during a second over-driving time period; and a drive-signal generator configured to generate a plurality of drive signals, which is selectively activated during the first over-driving time period, the active time period, and the second over-driving time period, to control the sense-amplifier driver.

In accordance with another embodiment of the present disclosure, a semiconductor device includes: a memory cell storing data; a sense-amplifier configured to sense and amplify the data using voltages applied to a pull-up power line and a pull-down power line; and a sense-amplifier driving device configured to provide a first pull-up voltage and a first pull-down voltage to the pull-up power line and the pull-down power line, respectively, during a first over-driving time period, provide a second pull-up voltage and the first pull-down voltage to the pull-up power line and the pull-down power line, respectively, during an active time period, and provide a third pull-up voltage and a second pull-down voltage to the pull-up power line and the pull-down power line, respectively, during a second over-driving time period.

It is to be understood that both the foregoing general description and the following detailed description of embodiments are not limiting, but are intended to provide further explanation of the invention as claimed.

BRIEF DESCRIPTION OF THE DRAWINGS

The above and other features and advantages of the subject matter of the present disclosure will be readily apparent from the following detailed description taken in conjunction with the accompanying drawings, wherein.

DESCRIPTION OF EMBODIMENTS

Reference will now be made in detail to various embodiments, examples of which are illustrated in the accompanying drawings. Wherever possible, the same reference numbers will be used throughout the drawings to refer to the same or like parts.

Figure 1:
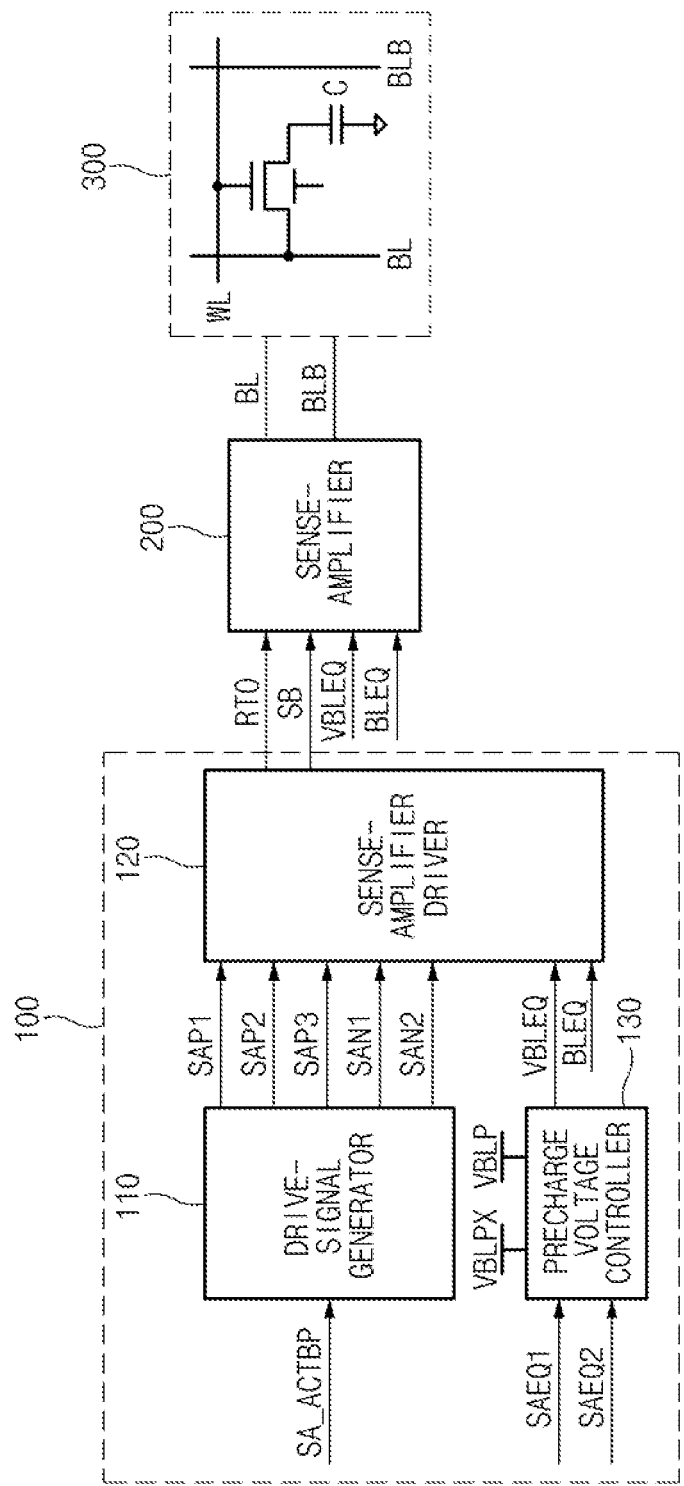
FIG. 1 illustrates a block diagram of a semiconductor device according to an embodiment.

FIG. 1 illustrates a block diagram of a semiconductor device according to an embodiment. Data stored in the semiconductor device is classified into high-level data having a logic high level H and denoted by '1' and low-level data having a logic low level L and denoted by '0'. In another embodiment, data values may be differently classified according to a voltage level and a current value. For binary data, a logic high level H is defined as a high voltage, and a logic low level L is defined as a low voltage lower than the high voltage.

Referring to FIG. 1, the semiconductor device includes a sense-amplifier driving device 100, a sense-amplifier 200, and a memory cell 300. In this embodiment, the sense-amplifier driving device 100 includes a drive-signal generator 110, a sense-amplifier driver 120, and a precharge voltage controller 130.

The drive-signal generator 110 generates a plurality of pull-up drive signals SAP1~SAP3 and a plurality of pull-down drive signals SAN1 and SAN2 according to an active signal SA_ACTBP. In an embodiment, the pull-up drive signals SAP1~SAP3 and the pull-down drive signals SAN1 and SAN2 are activated in response to the active signal SA_ACTBP during their reserved time periods. The active signal SA_ACTBP is activated to a low level after lapse of a reserved time from the input of an active command.

The sense-amplifier driver 120 provides power voltages to a pull-up power line RTO and a pull-down power line SB, which are connected to the sense-amplifier 200, upon receiving the pull-up drive signals SAP1~SAP3 and the pull-down drive signals SAN1, SAN2 so that the sense-amplifier driver 120 controls an over-driving operation.

In response to the pull-up drive signals SAP1~SAP3, the sense-amplifier driver 120 drives the pull-up power line RTO to one of a first pull-up voltage, e.g., a power-supply voltage VDD, a second pull-up voltage, e.g., a core voltage VCORE, or a third pull-up voltage, e.g., a pull-up voltage VCORE1 higher than the core voltage VCORE.

In response to the pull-down drive signals SAN1 and SAN2, the sense-amplifier driver 120 drives the pull-down power line SB to a first pull-down voltage, e.g., a ground voltage VSS, or a second pull-down voltage, e.g., a pull-down voltage VSBX. In addition, the sense-amplifier driver 120 controls the pull-up power line RTO and the pull-down power line SB to be precharged with an equalizing voltage VBLEQ in response to a precharge signal BLEQ.

In this embodiment, the pull-down voltage VSBX is set to a negative voltage, e.g., a back-bias voltage VBBW (or VBB) lower than the ground voltage VSS. However, in another embodiment, the pull-down voltage VSBX may have a positive voltage higher than the ground voltage VSS.

The precharge voltage controller 130 provides the equalizing voltage VBLEQ to the sense-amplifier driver 120 in response to sense-amp control signals SAEQ1 and SAEQ2.

In response to the sense-amplifier control signals SAEQ1 and SAEQ2, the precharge voltage controller 130 sets the equalizing voltage VBLEQ to have a precharge voltage VBLPX or a bit-line precharge voltage VBLP.

The precharge voltage VBLPX may be lower than the bit-line precharge voltage VBLP. However, since the precharge voltage VBLPX is changeable, it may be a negative voltage or a positive voltage.

The sense-amplifier 200 operates in response to a driving power source applied to the pull-up power line RTO and the pull-down power line SB. The sense-amplifier 200 senses and amplifies data received from the memory cell 300 through a bit line pair BL and BLB, and outputs the amplified data to a sensing line.

In addition, the sense-amplifier 200 precharges the bit line pair BL and BLB with the equalizing voltage VBLEQ in response to the precharge signal BLEQ. The bit line pair BL and BLB may be precharged with the precharge voltage VBLPX or the bit-line precharge voltage VBLP.

When a word line WL coupled to the memory cell 300 is activated, the memory cell 300 stores data received from the bit line BL or outputs stored data to the sense-amplifier 200 through the bit line BL.

A unit cell, i.e., the memory cell 300, includes a single switching element T and a single capacitor C. The switching element T is coupled between the bit line BL and the capacitor C. The switching element T is activated or deactivated according to the activation or deactivation of the word line WL. The capacitor C is coupled between a cell-plate voltage terminal and the switching element T so as to store data therein. If the word line WL is activated, the switching element T is turned on, so that the data received from the bit line BL is stored in the capacitor C or the data stored in the capacitor C is output to the bit line BL.

A sense-amplifier driving device 100 may have an active mode including three stages: an initial stage, a main stage, and a final stage. In the main stage of an active mode, the sense-amplifier driving device 100 may provide the core voltage VCORE to the pull-up power line RTO and the ground voltage VSS to the pull-down power line SB. In contrast, in a first over-driving mode, i.e., in the initial stage of the active mode, the sense-amplifier driving device 100 may provide a power-supply voltage VDD higher than the core voltage VCORE to the pull-up power line RTO.

In addition, in a second over-driving mode, i.e., the final stage of the active mode, the sense-amplifier driving device 100 provides a pull-up voltage VCORE1 higher than the core voltage VCORE to the pull-up power line RTO, and provides a back-bias voltage VBBW lower than the ground voltage VSS to the pull-down power line SB. As described above, in the active mode, the sense-amplifier driving device 100 provides the power-supply voltage VDD to the pull-up power line RTO during an initial reserved time period.

In a precharge mode, if the sense-amplifier control signal SAEQ2 is activated after the memory cell 300 has been deactivated, the sense-amplifier driving device 100 provides an equalizing voltage VBLEQ, which has a voltage level corresponding to that of the bit-line precharge voltage VBLP, to the pull-down power line SB and the pull-up power line RTO. In contrast, in an initial stage of the precharge mode, the sense-amplifier control signal SAEQ1 is activated, and the sense-amplifier driving device 100 provides an equalizing voltage VBLEQ, which has a voltage level corresponding to that of the precharge voltage VBLPX, to the pull-up power line RTO and the pull-down power line SB during the activation time of the sense-amplifier control signal SAEQ1. In an embodiment, the activation time of the sense-amplifier control signal SAEQ1 precedes the activation time of the sense-amplifier control signal SAEQ2.

In accordance with an embodiment, the bit-line precharge voltage VBLP may have a ½ VDD level. The precharge voltage VBLPX may have a voltage level lower than that of the bit-line precharge voltage VBLP. In an embodiment, the precharge voltage VBLPX may have a voltage level equal to or lower than that of the ground voltage VSS.

If the semiconductor device enters the precharge mode, the memory cell 300 is deactivated, and thus data is stored in the memory cell 300. In addition, during a time period in which the sense-amplifier control signal SAEQ2 is activated, an equalizing voltage VBLEQ having the voltage level of the precharge voltage VBLP may be provided to the bit line pair BL and BLB. In contrast, during a time period in which the sense-amplifier control signal SAEQ1 is activated, an equalizing voltage VBLEQ having the voltage level of the precharge voltage VBLPX may be provided to the bit line pair BL and BLB.

The semiconductor device may perform a first over-driving operation during a developing time of the bit line pair BL and BLB so as to improve a row address to column address delay tRCD. The semiconductor device controls the sense-amplifier driving device 100 to perform a second over-driving operation during a predetermined time period before the word line WL is deactivated, i.e., the memory cell is deactivated.

For example, if high-level data is stored in the memory cell 300, the sense-amplifier 200 amplifies the high-level data and re-stores the amplified high-level data in the memory cell 300. As a result, the pull-up voltage VCORE1 higher than the core voltage VCORE and the back-bias voltage VBBW lower than the ground voltage VSS may be applied to the pull-up and pull-down power lines RTO and SB, respectively, until just before the memory cell 300 is deactivated. As a result, the bit line BL may be driven with the pull-up voltage VCORE1 of the pull-up power line RTO by the sense-amplifier 200. Therefore, a data retention time of the memory cell 300 may be increased since the capacitor C of the memory cell 300 can be sufficiently charged with a high voltage, i.e., the pull-up voltage VCORE1, which is higher than the core voltage VCORE.

In a data write mode, if the memory cell 300 is activated and write data is applied to the bit line BL through a sensing line, the sense-amplifier 200 senses and amplifies the write data and transmits the amplified write data to the memory cell 300 through the bit line BL.

For example, if high-level write data is written in the memory cell 300, the sense-amplifier 200 may provide the write data having the voltage level of the core voltage VCORE to the memory cell 300.

Thereafter, the pull-up voltage VCORE1 higher than the core voltage VCORE and the back-bias voltage VBBW lower than the ground voltage VSS may be applied to the pull-up and pull-down power lines RTO and SB, respectively, until just before the memory cell 300 is deactivated. As a result, the bit line BL may be driven with the pull-up voltage VCORE1 of the pull-up power line RTO by the sense-amplifier 200. Since the capacitor C of the memory cell 300 is charged with the pull-up voltage VCORE1 higher than the core voltage VCORE, the capacitor C is charged in less time, and thus it is possible to reduce the time period tWR beginning with a time at which a write command is input and ending with a time at which a precharge command is input.

Activation of the memory cell 300 indicates that a cell transistor T is turned on by a control voltage received through the word line WL so that the cell capacitor C is electrically coupled to the bit line BL. On the other hand, deactivation of the memory cell 300 indicates that the cell transistor T is turned off so that the cell capacitor C is electrically disconnected with the bit line BL.

The semiconductor device may enter an operation mode based on an active command, a precharge command, a write command, a read command, etc. Generally, the semiconductor device may enter an operation mode after a reserved time lapses from an input time of a command signal determining the operation mode.

The semiconductor device may receive the write command or the read command during a specific time period after the active command is input and before the precharge command is input. That is, the semiconductor device may perform a write operation or a read operation during a time period between the input of the active command and the input of the precharge command.

Figure 2:
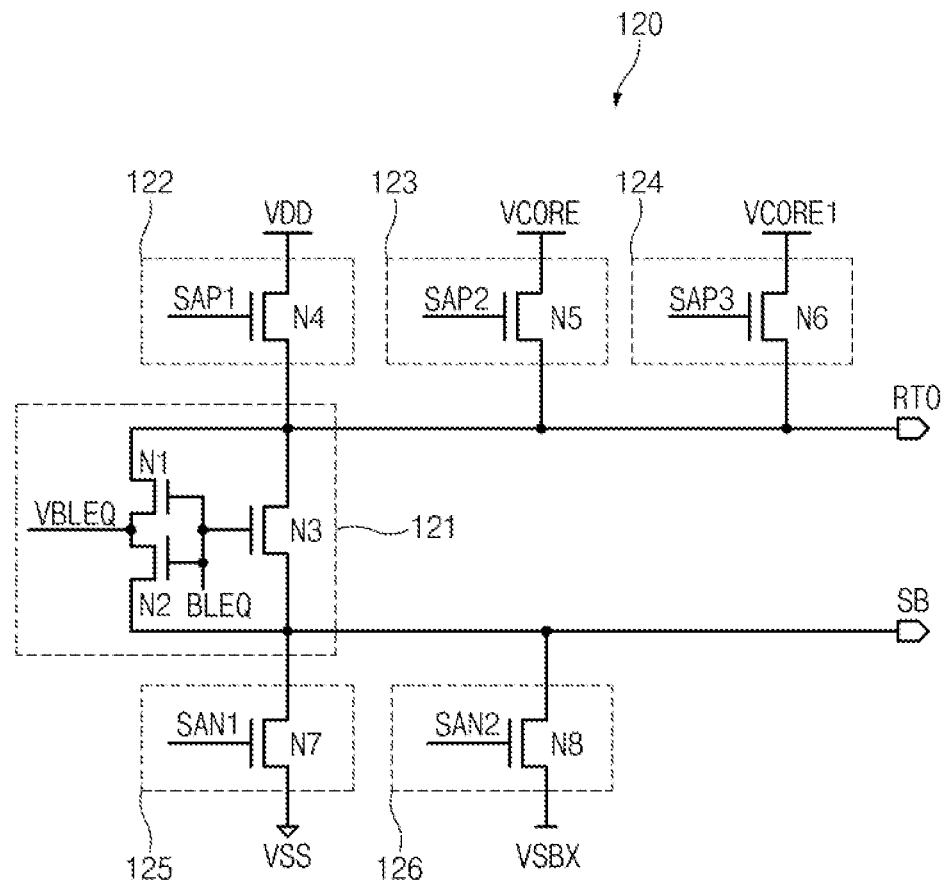
FIG. 2 illustrates a circuit diagram of a sense-amplifier driver according to an embodiment.

FIG. 2 illustrates a circuit diagram of the sense-amplifier driver 120 shown in FIG. 1 in accordance with an embodiment.

Referring to FIG. 2, the sense-amplifier driver 120 includes a precharge driving circuit 121, first to third pull-up driving circuits 122, 123, and 124, and first and second pull-down driving circuits 125 and 126.

In the precharge mode, the precharge driving circuit 121 provides an equalizing voltage VBLEQ having a variable voltage level to the pull-up power line RTO and the pull-down power line SB in response to the precharge signal BLEQ. The precharge driving circuit 121 includes a plurality of NMOS transistors N1~N3 having gate terminals commonly connected to one another to receive the precharge signal BLEQ.

The NMOS transistor N1 is coupled between an input terminal of the equalizing voltage VBLEQ and the pull-up power line RTO, and the NMOS transistor N2 is coupled between the input terminal of the equalizing voltage VBLEQ and the pull-down power line SB. The NMOS transistor N3 is coupled between the pull-up power line RTO and the pull-down power line SB.

In the active mode, if the pull-up drive signal SAP1 is activated during a first over-driving time period corresponding to an initial time period of the active mode, the first pull-up driving circuit 122 provides the power-supply voltage VDD acting as a first over-driving voltage to the pull-up power line RTO. The first pull-up driving circuit 122 includes an NMOS transistor N4. The NMOS transistor N4 is coupled between an input terminal of the power-supply voltage VDD and the pull-up power line RTO. The pull-up drive signal SAP1 is applied to a gate terminal of the NMOS transistor N4.

After that, if the pull-up drive signal SAP2 is activated during a main time period of the active mode, the second pull-up driving circuit 123 provides the core voltage VCORE to the pull-up power line RTO. The second pull-up driving circuit 123 includes an NMOS transistor N5. The NMOS transistor N5 is coupled between an input terminal of the core voltage VCORE and the pull-up power line RTO. The pull-up drive signal SAP2 is applied to a gate terminal of the NMOS transistor N5.

Subsequently, if the pull-up drive signal SAP3 is activated during a second over-driving time period corresponding to a final time period of the active mode, the third pull-up driving circuit 124 provides the pull-up voltage VCORE1 to the pull-up power line RTO. The third pull-up driving circuit 124 includes an NMOS transistor N6. The NMOS transistor N6 is coupled between an input terminal of the pull-up voltage VCORE1 and the pull-up power line RTO. The pull-up drive signal SAP3 is applied to a gate terminal of the NMOS transistor N6.

If the pull-down drive signal SAN1 is activated during the active mode, e.g., the first over-driving time period and the main time period, the first pull-down driving circuit 125 provides the ground voltage VSS to the pull-down power line SB. The first pull-up driving circuit 125 includes an NMOS transistor N7. The NMOS transistor N7 is coupled between an input terminal of the ground voltage VSS and the pull-down power line (SB). The pull-down drive signal SAN1 is applied to a gate terminal of the NMOS transistor N7.

After that, if the pull-down drive signal SAN2 is activated during the active mode, e.g., the second over-driving time period, the second pull-down driving circuit 126 provides the pull-down voltage VSBX to the pull-down power line SB. The second pull-down driving circuit 126 includes an NMOS transistor N8. The NMOS transistor N8 is coupled between an input terminal of the pull-down voltage VSBX and the pull-down power line SB. The pull-down drive signal SAN2 is applied to a gate terminal of the NMOS transistor N8.

Figure 3:
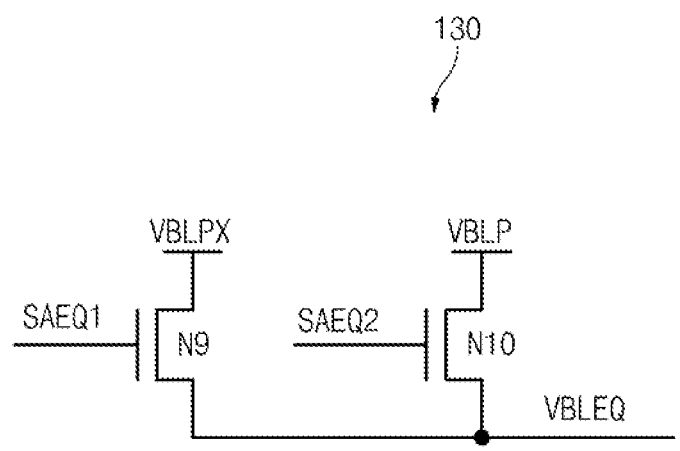
FIG. 3 illustrates a circuit diagram of a precharge voltage controller according to an embodiment.

FIG. 3 illustrates a circuit diagram of the precharge voltage controller 130 shown in FIG. 1 according to an embodiment. The precharge voltage controller 130 includes NMOS transistors N9 and N10.

The NMOS transistor N9 is coupled between an input terminal of the precharge voltage VBLPX and an output terminal of the equalizing voltage VBLEQ. The sense-amplifier control signal SAEQ1 is applied to a gate terminal of the NMOS transistor N9. The NMOS transistor N10 is coupled between an input terminal of the bit-line precharge voltage VBLP and the output terminal of the equalizing voltage VBLEQ. The sense-amplifier control signal SAEQ2 is applied to a gate terminal of the NMOS transistor N10.

If the precharge signal BLEQ is activated to a high level, the precharge voltage controller 130 turns on the NMOS transistor N9 for a predetermined time in response to the sense-amplifier control signal SAEQ1. Accordingly, the precharge voltage controller 130 outputs the equalizing voltage VBLEQ, which corresponds to the precharge voltage VBLPX, to the precharge driving circuit 121 and the sense-amplifier 200.

After lapse of the predetermined time after the precharge signal BLEQ is activated, the precharge voltage controller 130 turns on the NMOS transistor N10 in response to the sense-amplifier control signal SAEQ2. Accordingly, the precharge voltage controller 130 outputs the equalizing voltage VBLEQ, which corresponds to the precharge voltage VBLP, to the precharge driving circuit 121 and the sense-amplifier 200.

Figure 4:
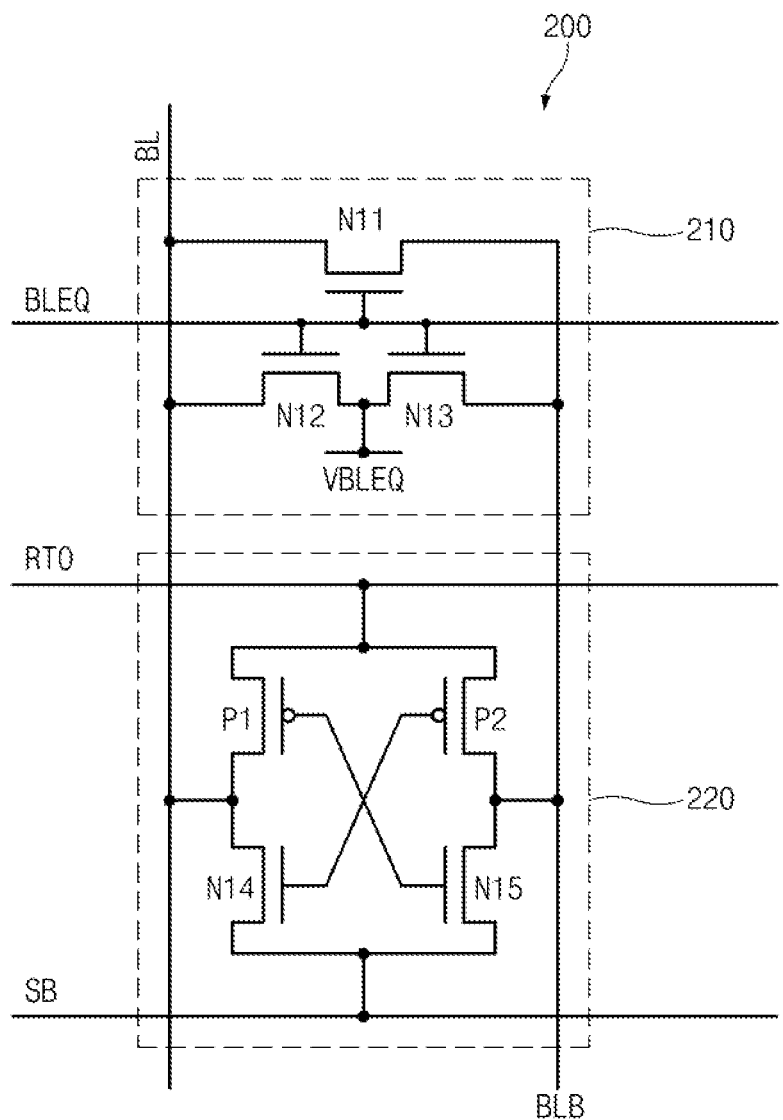
FIG. 4 illustrates a circuit diagram of a sense-amplifier according to an embodiment.

FIG. 4 illustrates a circuit diagram of the sense-amplifier 200 shown in FIG. 1 according to an embodiment. The sense-amplifier 200 includes a precharge circuit 210 and a sensing circuit 220.

The precharge circuit 210 includes a plurality of NMOS transistors N11~N13 having gate terminals commonly coupled to one another. The NMOS transistor N11 is coupled between the bit line BL and the bit line bar BLB. The NMOS transistors N12 and N13 are coupled in series between the bit line BL and the bit line bar BLB. The NMOS transistors N12 and N13 receive the equalizing voltage VBLEQ through their respective drain terminals that are coupled to each other. The NMOS transistors N11~N13 receive the precharge signal BLEQ through their commonly coupled gate terminals.

If the precharge signal BLEQ is activated to a high level, all NMOS transistors N11~N13 of the precharge circuit 210 are turned on so that the bit line pair BL and BLB is precharged with the equalizing voltage VBLEQ. On the other hand, if the precharge signal BLEQ is deactivated to a low level, all NMOS transistors N11~N13 are turned off.

The sensing circuit 220 includes PMOS transistors P1 and P2 and NMOS transistors N14 and N15, which are complementarily coupled to one another in the form of a cross-coupled latch between the pull-up power line RTO and the pull-down power line SB. Gate terminals of the PMOS transistors P1 and P2 and the NMOS transistors N14 and N15 are cross-coupled to one another.

The PMOS transistor P1 and the NMOS transistor N14 are coupled in series between the pull-up power line RTO and the pull-down power line SB. Commonly coupled drain terminals of the PMOS transistor P1 and the NMOS transistor N14 are coupled to the bit line BL. The PMOS transistor P2 and the NMOS transistor N15 are coupled in series between the pull-up power line RTO and the pull-down power line SB. Commonly coupled drain terminals of the PMOS transistor P2 and the NMOS transistor N15 are coupled to the bit line bar BLB.

Therefore, the sensing circuit 220 may sense and amplify data in the latch structure composed of the PMOS transistors P1 and P2 and the NMOS transistors N14 and N15 in response to drive signals provided through the pull-up power line RTO and the pull-down power line SB.

Figure 5:
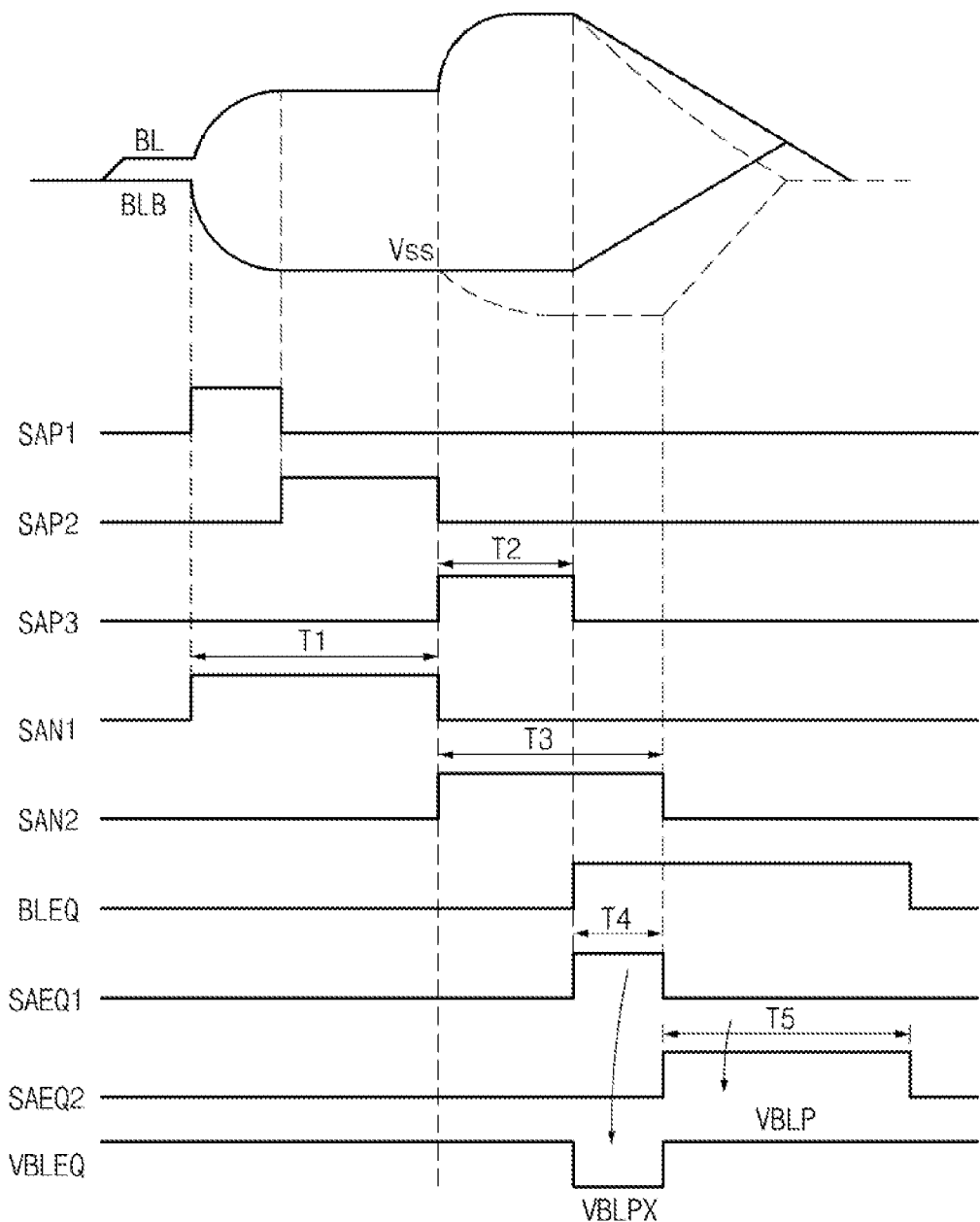
FIG. 5 is a timing diagram illustrating operations of the semiconductor device shown in FIG. 1.

FIG. 5 is a timing diagram illustrating operations of the sense-amplifier driving device 100 shown in FIG. 1. Operations of the sense-amplifier driving device 100 in accordance with embodiments will be described with reference to FIGS. 1 to 5.

Referring to FIGS. 1, 2 and 5, the transistors N1~N3 of the precharge driving circuit 121 are turned off in an active mode in which the precharge signal BLEQ is at a low level. Accordingly, the equalizing voltage VBLEQ is not applied to the pull-up power line RTO and the pull-down power line SB.

If the word line WL coupled to the memory cell 300 storing high-level data is activated after an active command is input, and thus the active mode is activated, the semiconductor device enters a first over-driving time period at a developing time of the bit line pair BL and BLB. In the first over-driving time period, the pull-down drive signal SAN1 and the pull-up drive signal SAP1 are at a high level.

If the pull-up drive signal SAP1 is at the high level, the NMOS transistor N4 of the first pull-up driver 122 is turned on, and thus the pull-up power line RTO is driven with the power-supply voltage VDD. If the pull-down drive signal SAN1 is at the high level, the NMOS transistor N7 of the first pull-down driving circuit 125 is turned on, and thus the pull-down power line SB is driven with the ground voltage VSS.

During the first over-driving time period, since the pull-up drive signals SAP2 and SAP3 and the pull-down drive signal SAN2 are at a low level, the second and third pull-up driving circuits 123 and 124 and the second pull-down driving circuit 126 remain turned off.

In the active mode, after lapse of the first over-driving time period, the pull-up drive signal SAP1 transitions to a low level, and the pull-up drive signal SAP2 transitions to a high level. As a result, the first pull-up driving circuit 122 is turned off, and the second pull-up driving circuit 123 is turned on. Accordingly, the pull-up power line RTO is driven with the core voltage VCORE provided by the second pull-up driving circuit 123. At this time, the pull-down drive signal SAN1 remains at the high level, and thus the ground voltage VSS is still applied to the pull-down power line SB. The pull-down drive signal SAN1 is in an enable state for a time period T1 corresponding to a sum of the time periods during which the pull-up drive signals SAP1 and SAP2 are activated to a high level.

A voltage level of the pull-up power line RTO increases in the first over-driving time period, and then maintains the core voltage VCORE while the pull-up drive signal SAP2 is at the high level after lapse of the first over-driving time period.

The word line WL is in an activated state before the precharge signal BLEQ transitions to a high level. If the precharge signal BLEQ transitions to the high level, the semiconductor device enters a precharge mode, and the word line WL is deactivated.

A time period T2 in the active mode before the word line WL is deactivated is used as a second over-driving time period. During the second over-driving time period T2, while the pull-up drive signals SAP1 and SAP2 and the pull-down drive signal SAN1 are at a low level, the pull-up drive signal SAP3 and the pull-down drive signal SAN2 transition to a high level.

If the pull-up drive signal SAP3 is at the high level, the NMOS transistor N6 of the third pull-up controller 124 is turned on, and thus the pull-up power line RTO is driven with the pull-up voltage VCORE1 higher than the core voltage VCORE.

If the pull-down drive signal SAN2 is at the high level, the NMOS transistor N8 of the second pull-down controller 126 is turned on, and thus the pull-down power line SB is driven with the back-bias voltage VBBW.

During the second over-driving time period T2, since the pull-up drive signals SAP1 and SAP2 and the pull-down drive signal SAN1 are at the low level, the first and second pull-up driving circuits 122 and 123 and the first pull-down driving circuit 125 remain turned off.

Subsequently, since the pull-down drive signal SAN2 remains at the high level during a time period T3, a low-level potential of the bit line bar BLB is reduced during a predetermined time, as shown in FIG. 5. As a result, stability of low-level data from among various pieces of cell data can be guaranteed. In accordance with an embodiment, the time period T3 may be in an enable state until the sense-amplifier control signal SAEQ1 is disabled to a low level after the precharge signal BLEQ is enabled. In FIG. 5, the time period T3 corresponds to the beginning of the second over-driving time period T2 until the activation time of the sense-amplifier control signal SAEQ1. However, embodiments are not limited thereto, and the pull-down drive signal SAN2 may be disabled before the sense-amplifier control signal SAEQ1 is disabled.

As described above, a voltage level of the pull-up power line RTO increases in the second over-driving time period T2. After that, if the precharge signal BLEQ is enabled to a high level, the pull-up power line RTO is precharged with the precharge voltage VBLPX for a first precharge time period T4 after lapse of the second over-driving time period T2. A voltage level of the pull-down power line SB decreases in the second over-driving time period T2. After that, the pull-down power line SB is precharged with the precharge voltage VBLP after lapse of the first precharge time period T4.

In other words, if the semiconductor device enters the precharge mode in response to the precharge signal BLEQ enabled to the high level, the NMOS transistors N1~N3 of the precharge driving circuit 121 are turned on. In the precharge mode, if the sense-amplifier control signal SAEQ1 is activated to a high level during the first precharge time period T4 corresponding to a first time period after the precharge signal BLEQ is enabled to the high level, the precharge voltage VBLPX is applied to the pull-up power line RTO and the pull-down power line SB. In the precharge mode, since the NMOS transistors N11~N13 of the precharge circuit 210 shown in FIG. 4 are also turned on, the precharge voltage VBLPX is also applied to the bit line pair BL and BLB.

Thereafter, if the sense-amplifier control signal SAEQ1 transitions to a low level and the sense-amplifier control signal SAEQ2 is activated to a high level, i.e., the first precharge time section T4 is over, the bit line precharge voltage VBLP is applied to the pull-up power line RTO and the pull-down power line SB during a second precharge time period T5 corresponding to a second time period following the first time period T4 after the precharge signal BLEQ is enabled. During the second precharge time period T5, which is over when the precharge signal BLEQ is disabled, the NMOS transistors N11~N13 of the precharge circuit 210 are still turned on so that the bit line precharge voltage VBLP is applied to the bit line pair BL and BLB.

Since the memory cell 300 may share electric charges with the bit line BL, if low-level data is stored in the memory cell 300, the voltage level of the bit line BL decreases like the voltage level of the bit line bar BLB shown in FIG. 5.

If the voltage level of the bit line BL is changed, the sense-amplifier 200 may sense and amplify a voltage difference $\Delta V$ of the bit line pair BL and BLB. As a result, the bit line pair BL and BLB is driven by the power-supply voltage VDD and the ground voltage VSS during the first over-driving time period T1. In this case, the power-supply voltage VDD acting as the over-driving voltage is used to reduce the amplification time. A specific time tRCD ranging from an input time of the active command to an input time of a write command can be reduced by performing the over-driving operation.

Upon receiving the write command, if high-level write data is applied to the bit-line BL, the sense-amplifier 200 drives the bit line BL with the core voltage VCORE, and drives the bit line bar BLB with the ground voltage VSS.

Thereafter, the bit line pair BL and BLB may be driven by the pull-up voltage VCORE1 and the back-bias voltage VBBW during the second over-driving time period T2. That is, until the memory cell 300 is deactivated in a time period prior to receiving the precharge command, the bit line BL is driven with the pull-up voltage VCORE1, and the bit line bar BLB is driven with the back-bias voltage VBBW.

Through the over-driving operation, a specific time tWR ranging from the input time of the write command to an input time of the precharge command can be reduced. In addition, if data is stored in the memory cell 300 with the back-bias voltage VBBW lower than the ground voltage VSS during the second over-driving time period T2, refresh characteristics of low-level data '0' can be improved.

The bit line BL and the bit line bar BLB are precharged during an activation time of the precharge signal BLEQ, and the activation time of the precharge signal BLEQ, which serves as a control signal for precharging the pull-up power line RTO and the pull-down power line SB, may be controlled by adjusting a deactivation time of the memory cell 300, i.e., a deactivation time of the word line WL to which the memory cell 300 is coupled.

As described above, a semiconductor device according to an embodiment may transfer data to the memory cell 300 using a drive voltage corresponding to data in the active mode, i.e., a write mode. In the precharge mode, until the memory cell 300 is deactivated, the memory cell 300 may receive data driven by an over-driving voltage higher or lower than the drive voltage.

That is, the sense-amplifier 200 may sense and amplify read data of the memory cell 300, which is transferred through the bit line pair BL and BLB, in the active mode, and may output the amplified data having a drive voltage corresponding to the read data. After that, during a predetermined time period, until the memory cell 300 is deactivated and before entering the precharge mode, the data applied to the memory cell 300 may be driven by an over-driving voltage higher or lower than the drive voltage. As a result, a data retention time of the memory cell 300 can be improved.

The sense-amplifier 200 may transfer write data to the memory cell 300 using a drive voltage corresponding to the write data during the write mode. After that, during a predetermined time period, until the memory cell 300 is deactivated and before entering the precharge mode, the write data applied to the memory cell 300 may be driven by an over-driving voltage higher or lower than the drive voltage. Accordingly, a data transmission time to the memory cell 300 and a data retention time of the memory cell 300 can be improved.

The descriptions provided above have disclosed an explanation of embodiments of the present disclosure. Embodiments may include additional structures that are not directly associated with technical features of embodiments of the present disclosure. Descriptions of such additional structures have been omitted to enhance understanding of embodiments. In addition, those skilled in the art will recognize that various modifications may be made to embodiments as described without departing from the intended scope of the present disclosure. For example, Active High or Active Low constructions for indicating activation states of a signal and a circuit may be changed according to an embodiment. A transistor connection structure may be changed to implement substantially the same function. That is, a PMOS transistor may be replaced with an NMOS transistor and vice versa, or may be replaced with other types of transistors, depending on the embodiment.

As is apparent from the above description, a semiconductor device including a sense-amplifier driving device according to embodiments can improve equalization characteristics by changing a specific voltage that equalizes power lines driving a sense-amplifier and bit lines.

A semiconductor device including a sense-amplifier driving device according to embodiments can improve a data retention time during which a memory cell can reliably maintain data.

A semiconductor device including a sense-amplifier driving device according to embodiments stores low-level data in a memory cell using a voltage lower than a ground voltage during an over-driving time, such that refresh characteristics of the low-level data, e.g., data of '0', can be improved.

A semiconductor device including a sense-amplifier driving device according to embodiments can increase a refresh time period, such that an access time of a memory cell further increases, resulting in improvement of throughput of the semiconductor device.

Those skilled in the art will appreciate that embodiments of the present disclosure may be carried out in other specific ways than those set forth herein without departing from the spirit and essential characteristics of the present disclosure. The above embodiments are therefore to be construed in all aspects as illustrative and not restrictive.

The scope of the present disclosure should be determined by the appended claims and their legal equivalents, not by the above description, and all changes coming within the meaning and equivalency range of the appended claims are intended to be embraced therein. Also, it will be obvious to those skilled in the art that claims that are not explicitly cited in each other in the appended claims may be presented in combination as an embodiment of the present disclosure or included as a new claim by a subsequent amendment after the application is filed.

Although a number of illustrative embodiments have been described, it should be understood that numerous other modifications and embodiments can be devised by those skilled in the art that will fall within the spirit and scope of the principles of the present disclosure. Particularly, numerous variations and modifications are possible in the component parts and/or arrangements which are within the scope of the present disclosure, the drawings and the accompanying claims. In addition to variations and modifications in the component parts and/or arrangements, alternative uses will also be apparent to those skilled in the art.

What is claimed is:

1. A sense-amplifier driving device, comprising:
    a sense-amplifier driver configured to provide a first pull-up voltage and a first pull-down voltage to a pull-up power line and a pull-down power line, respectively, during a first over-driving time period, provide a second pull-up voltage and the first pull-down voltage to the pull-up power line and the pull-down power line, respectively, during an active time period, and provide a third pull-up voltage and a second pull-down voltage to the pull-up power line and the pull-down power line, respectively, during a second over-driving time period; and
    a drive-signal generator configured to generate a plurality of drive signals, which is selectively activated during the first over-driving time period, the active time period, and the second over-driving time period, to control the sense-amplifier driver.

2. The sense-amplifier driving device according to claim 1, wherein the first over-driving time period is a time period in which data is developed to a bit line coupled to a memory cell after an active command is input and a word line coupled to the memory cell is enabled.

3. The sense-amplifier driving device according to claim 1, wherein the second over-driving time period is a time period before a word line coupled to a memory cell is disabled, prior to the beginning of a precharge time period.

4. The sense-amplifier driving device according to claim 1, wherein the first pull-up voltage is a power-supply voltage.

5. The sense-amplifier driving device according to claim 1, wherein the first pull-down voltage is a ground voltage.

6. The sense-amplifier driving device according to claim 1, wherein the second pull-up voltage is a core voltage lower than a power-supply voltage.

7. The sense-amplifier driving device according to claim 1, wherein the second pull-down voltage is a back-bias voltage lower than a ground voltage.

8. The sense-amplifier driving device according to claim 1, wherein the third pull-up voltage is a pull-up voltage higher than a core voltage.

9. The sense-amplifier driving device according to claim 1, wherein the sense-amplifier driver includes:
    a first pull-up driver configured to provide the first pull-up voltage to the pull-up power line when a first pull-up drive signal is activated in the first over-driving time period;
    a second pull-up driver configured to provide the second pull-up voltage lower than the first pull-up voltage to the pull-up power line when a second pull-up drive signal is activated in the active time period;
    a third pull-up driver configured to provide the third pull-up voltage higher than the second pull-up voltage when a third pull-up drive signal is activated in the second over-driving time period;

a first pull-down driver configured to provide the first pull-down voltage to the pull-down power line when a first pull-down drive signal is activated in the first over-driving time period; and a second pull-down driver configured to provide the second pull-down voltage lower than the first pull-down voltage to the pull-down power line when a second pull-down drive signal is activated in the second over-driving time period.

10. The sense-amplifier driving device according to claim 9, wherein the sense-amplifier driver further includes:
  a precharge voltage controller configured to provide an equalizing voltage for precharging the pull-up power line and the pull-down power line when a precharge signal is activated.

11. The sense-amplifier driving device according to claim 10, wherein:
  when a first sense-amplifier control signal is activated, the precharge voltage controller provides the equalizing voltage having a first voltage level to the pull-up power line and the pull-down power line; and
  when a second sense-amplifier control signal is activated, the precharge voltage controller provides the equalizing voltage having a second voltage level higher than that of the first precharge voltage to the pull-up power line and the pull-down power line.

12. The sense-amplifier driving device according to claim 10, wherein the precharge voltage controller includes:
  a first transistor coupled to and disposed between an output terminal of the equalizing voltage and an input terminal of the first precharge voltage and receiving a first sense-amplifier control signal through a gate terminal; and
  a second transistor coupled to and disposed between the output terminal of the equalizing voltage and an input terminal of a second precharge voltage and receiving a second sense-amplifier control signal through a gate terminal.

13. A semiconductor device, comprising:
  a memory cell storing data;
  a sense-amplifier configured to sense and amplify the data using voltages applied to a pull-up power line and a pull-down power line; and
  a sense-amplifier driving device configured to provide a first pull-up voltage and a first pull-down voltage to the pull-up power line and the pull-down power line, respectively, during a first over-driving time period, provide a second pull-up voltage and the first pull-down voltage to the pull-up power line and the pull-down power line, respectively, during an active time period, and provide a third pull-up voltage and a second pull-down voltage to the pull-up power line and the pull-down power line, respectively, during a second over-driving time period.

14. The semiconductor device according to claim 13, wherein the sense-amplifier driving device includes:
  a sense-amplifier driver configured to provide the first pull-up voltage and the first pull-down voltage during the first over-driving time period, provide the second pull-up voltage and the first pull-down voltage during the active time period, and provide the third pull-up voltage and the second pull-down voltage during the second over-driving time period; and
  a drive-signal generator configured to generate a plurality of drive signals, which is selectively activated during the first over-driving time period, the active time period, and the second over-driving time period, to control the sense-amplifier driver.

15. The semiconductor device according to claim 13, wherein the first pull-up voltage is a power-supply voltage, and the first pull-down voltage is a ground voltage.

16. The semiconductor device according to claim 13, wherein the second pull-up voltage is a core voltage lower than a power-supply voltage, the second pull-down voltage is a back-bias voltage lower than a ground voltage, and the third pull-up voltage is a pull-up voltage higher than the core voltage.

17. The semiconductor device according to claim 13, wherein the sense-amplifier driver includes:
  a first pull-up driver configured to provide the first pull-up voltage to the pull-up power line when a first pull-up drive signal is activated in the first over-driving time period;
  a second pull-up driver configured to provide the second pull-up voltage lower than the first pull-up voltage to the pull-up power line when a second pull-up drive signal is activated in the active time period;
  a third pull-up driver configured to provide the third pull-up voltage higher than the second pull-up voltage when a third pull-up drive signal is activated in the second over-driving time period;
  a first pull-down driver configured to provide the first pull-down voltage to the pull-down power line when a first pull-down drive signal is activated in the first over-driving time period; and
  a second pull-down driver configured to provide the second pull-down voltage lower than the first pull-down voltage to the pull-down power line when a second pull-down drive signal is activated in the second over-driving time period.

18. The semiconductor device according to claim 17, wherein the sense-amplifier driver further includes:
  a precharge voltage controller configured to provide an equalizing voltage for precharging the pull-up power line and the pull-down power line when a precharge signal is activated.

19. The semiconductor device according to claim 18, wherein:
  when a first sense-amplifier control signal is activated, the precharge voltage controller provides the equalizing voltage having a first precharge voltage level to the pull-up power line and the pull-down power line; and
  when a second sense-amplifier control signal is activated, the precharge voltage controller provides the equalizing voltage having a second precharge voltage level higher than that of the first precharge voltage to the pull-up power line and the pull-down power line.

20. The semiconductor device according to claim 13, wherein the sense-amplifier further includes a precharge circuit configured to provide an equalizing voltage having a first precharge voltage level to a bit line pair when a first sense-amplifier control signal is activated, and to provide the equalizing voltage having a second precharge voltage level higher than that of the first precharge voltage to the bit line pair when a second sense-amplifier control signal is activated.

* * * * *